US009577350B2

(12) United States Patent
Chen

(10) Patent No.: US 9,577,350 B2
(45) Date of Patent: Feb. 21, 2017

(54) PIN AND A PRINTED CIRCUIT BOARD

(71) Applicant: DELTA ELECTRONICS (Shanghai) CO., LTD., Shanghai (CN)

(72) Inventor: Shaojun Chen, Shanghai (CN)

(73) Assignee: DELTA ELECTRONICS (SHANGHAI) CO., LTD. (CN)

( * ) Notice: Subject to any disclaimer, the term of this patent is extended or adjusted under 35 U.S.C. 154(b) by 22 days.

(21) Appl. No.: 14/602,726

(22) Filed: Jan. 22, 2015

(65) Prior Publication Data

US 2015/0207239 A1 Jul. 23, 2015

(30) Foreign Application Priority Data

Jan. 23, 2014 (CN) .......................... 2014 1 0031372

(51) Int. Cl.
*H05K 1/11* (2006.01)
*H01R 4/02* (2006.01)
*H01R 12/58* (2011.01)
*H01R 43/02* (2006.01)

(52) U.S. Cl.
CPC .............. *H01R 4/029* (2013.01); *H01R 12/58* (2013.01); *H01R 43/0256* (2013.01)

(58) Field of Classification Search
CPC .............. H05K 1/00; H05K 1/11; H05K 3/22; H05K 3/30; H05K 3/34; H05K 3/40; H05K 7/10; H01R 9/00; H01R 9/16; H01R 13/02; H01R 13/04; H01R 13/42; H01R 13/428; H01R 43/00; H01R 43/16; H01R 43/02; H01R 43/20
USPC ............ 174/167, 126.1, 254, 257, 260, 266; 439/82–85, 751, 870, 873, 876, 884, 885; 29/845, 837, 874, 884, 843, 739; 361/220, 361/791
See application file for complete search history.

(56) References Cited

U.S. PATENT DOCUMENTS

| | | | | |
|---|---|---|---|---|
| 3,601,750 | A * | 8/1971 | Mancini | 439/84 |
| 4,017,142 | A * | 4/1977 | Clark et al. | 439/870 |
| 4,265,508 | A * | 5/1981 | Chisholm | 439/885 |
| 4,469,394 | A * | 9/1984 | Verhoeven | 439/873 |
| 4,501,065 | A * | 2/1985 | Zemek et al. | 29/845 |
| 4,530,551 | A * | 7/1985 | Benasutti | 439/78 |
| 4,534,603 | A * | 8/1985 | Brown et al. | 439/82 |
| 4,544,802 | A * | 10/1985 | Siden | 174/254 |
| 4,606,589 | A * | 8/1986 | Elsbree et al. | 439/78 |
| 4,740,166 | A * | 4/1988 | Barnhouse | 439/82 |
| 4,746,301 | A * | 5/1988 | Key | 439/82 |
| 4,822,288 | A * | 4/1989 | Conley | 439/84 |
| 4,831,728 | A * | 5/1989 | Barnhouse | 29/874 |

(Continued)

FOREIGN PATENT DOCUMENTS

TW 201349674 12/2013

*Primary Examiner* — Xiaoliang Chen
(74) *Attorney, Agent, or Firm* — Hauptman Ham, LLP

(57) ABSTRACT

A pin and a printed circuit board are provided. The pin includes a pin body and an insertion head. The insertion head is disposed on an end of the pin body and includes a base and a guide post. The shape of the base is a cylinder, the bottom of which is located on the end of the pin body. The shape of the guide post is a prism, which is coaxially connected to the base. The projection of a circumcircle of a cross section of the guide post is overlapped with that of a cross sectional circle of the base along the direction of an axis of the guide post. The advantage of the prevent invention is to decrease the tilt of the pin body after inserted, reduce the solder material between the base and the insertion hole, and improve the welding quality.

10 Claims, 4 Drawing Sheets

(56) References Cited

U.S. PATENT DOCUMENTS

| | | | | |
|---|---|---|---|---|
| 4,883,435 | A * | 11/1989 | Seidler | 439/876 |
| 4,978,308 | A * | 12/1990 | Kaufman | 439/83 |
| 5,106,328 | A * | 4/1992 | Prochaska et al. | 439/751 |
| 5,373,626 | A * | 12/1994 | Youngfleish | 29/739 |
| 5,410,452 | A * | 4/1995 | Sinclair et al. | 361/791 |
| 5,487,684 | A * | 1/1996 | Schalk et al. | 439/751 |
| 5,571,022 | A * | 11/1996 | Schaarschmidt | 439/135 |
| 5,589,669 | A * | 12/1996 | Downes et al. | 174/266 |
| 5,616,053 | A * | 4/1997 | Bogursky et al. | 439/590 |
| 5,816,868 | A * | 10/1998 | Legrady et al. | 439/876 |
| 5,886,309 | A * | 3/1999 | Hosogai et al. | 200/1 R |
| 5,893,779 | A * | 4/1999 | Bianca et al. | 439/751 |
| 5,915,999 | A * | 6/1999 | Takenaka et al. | 439/751 |
| 5,960,537 | A * | 10/1999 | Vicich et al. | 29/843 |
| 6,976,855 | B2 * | 12/2005 | Kennedy et al. | 439/83 |
| 2006/0166526 | A1 * | 7/2006 | Lee et al. | 439/75 |
| 2008/0009155 | A1 * | 1/2008 | Ide et al. | 439/83 |
| 2009/0038823 | A1 * | 2/2009 | Furihata et al. | 174/126.1 |
| 2010/0122458 | A1 * | 5/2010 | Woods et al. | 29/884 |
| 2013/0295797 | A1 * | 11/2013 | Hoffmeyer | 439/884 |

* cited by examiner

PIN AND A PRINTED CIRCUIT BOARD

BACKGROUND OF THE INVENTION

Field of the Invention

The present invention relates to the field of the manufacture of electronic components, and more particularly to a pin and a printed circuit board.

Description of the Prior Art

A printed circuit board is widely applied to data switching exchange and telecom equipment. Electronic components of the printed circuit board are mostly mounted on the printed circuit board by a surface mounted technology. In view of economical efficiency and quality, automatic assembly of the mechanism parts on the printed circuit board needs to be realized. Ensuring the quality at the same time as realizing assembly automation is a problem faced in the design of the mechanism.

A pin is a most common and necessary component of the printed circuit board. When the pin is assembled by automatically picking and placing, it is necessary to form a gap between the pin and an insertion hole, thereby satisfying the requirement of manufacturing processes. But an oversized gap could result in a tilt of the pin and cause quality problems. Therefore, the gap between the pin and the insertion hole must be reduced as much as possible when designing the pin. In order to avoid the pin not being smoothly inserted into the insertion hole of the printed circuit board during assembly, the size of an insertion head of the pin must be smaller than that of the insertion hole of the printed circuit board. That is, the pin and the insertion hole should be in a clearance fit.

FIG. 1A is a structural schematic view of a pin in the prior art. The pin includes a pin body 10, an insertion head 11 and a welding head 12. The insertion head 11 is disposed on an end of the pin body 10, and the welding head 12 is disposed on an opposite end of the pin body 10 to the insertion head 11. The insertion head 11 is cylindrical.

FIG. 1B is a structural schematic view of another pin in the prior art. In FIG. 1B, the pin includes a pin body 10', an insertion head 11' located on an end of the pin body 10', and a welding head 12' located on an opposite end of the pin body 10' to the insertion head 11'. The shape of the insertion head 11' is a quadrangular prism.

In FIGS. 1A and 1B, the shapes of the insertion heads are single, which are cylindrical or a quadrangular prism. In the course of inserting the pin into the insertion hole of the printed circuit board, the cylinder has a greater risk of touching the edge of the insertion hole than the quadrangular prism, the circumcircle of which has the same diameter as that of the cylinder. However, the prism, the cross section of which is polygonal, can result in an oversized gap between the insertion head and the insertion hole. The oversized gap needs to be filled with more solder material to avoid a problem of poor welding.

BRIEF SUMMARY OF THE INVENTION

One object of the present invention is to provide a pin and a printed circuit board, wherein a clearance gap between a pin and an insertion hole of the printed circuit board is small and the pin is easily inserted into the insertion hole.

To solve the above problems, the present invention provides a pin which comprises a pin body and an insertion head. The insertion head is disposed on an end of the pin body and includes a base and a guide post. The base is cylindrical, the bottom of which is located on the end of the pin body. The shape of the guide post is a prism, which is coaxially connected to the base. The projection of a circumcircle of a cross section of the guide post is overlapped with that of a cross sectional circle of the base along the direction of an axis of the guide post. Both the cross section of the guide post and the cross sectional circle of the base are perpendicular to the axis of the guide post.

The pin further comprises a welding head, which is disposed on an opposite end of the pin body to the insertion head.

The pin body further has a cut located on two opposite sides of the welding head.

The prism can be selected from any one of a triangular prism, a quadrangular prism, and a hexagonal prism.

The guide post has a chamfer formed on a connection position between an end surface of the guide post and a side wall of the guide post.

The present invention further provides a printed circuit board comprising an insertion hole and a pin. The pin is inserted into the insertion hole and comprises a pin body and an insertion head. The insertion head is disposed on an end of the pin body and includes a base and a guide post. The base is cylindrical, the bottom of which is located on the end of the pin body. The shape of the guide post is a prism, which is coaxially connected to the base. The projection of a circumcircle of a cross section of the guide post is overlapped with that of a cross sectional circle of the base along the direction of an axis of the guide post. Both the cross section of the guide post and the cross section circle of the base are perpendicular to the axis of the guide post.

The advantage of the pin and the printed circuit board of the prevent invention is that the pin of the present invention disposes the guide post having a polygonal cross section and the base having a circular section, wherein the guide post can maximally avoid rigidly touching the insertion hole and the risk of not being inserted. The projection of the circumcircle of a cross section of the guide post is overlapped with that of the cross sectional circle of the base along the axis of the guide post, so that it can ensure that the base can be smoothly inserted into the insertion hole after the guide post enters into the insertion hole. Due to the guiding function provided by the guide post, a clearance gap between the base and the insertion hole could be smaller than the clearance gap produced in the prior art. In the present invention, the clearance gap between the base and the insertion hole is reduced, thereby decreasing the tilt of the pin body after inserted, reducing the solder material between the base and the insertion hole, and improving the welding quality.

DETAILED DESCRIPTION OF THE PREFERRED EMBODIMENTS

The specific embodiments of a pin and a printed circuit board provided by the present invention will be described in detail herein with reference to the accompanying drawings.

Figure 2A:
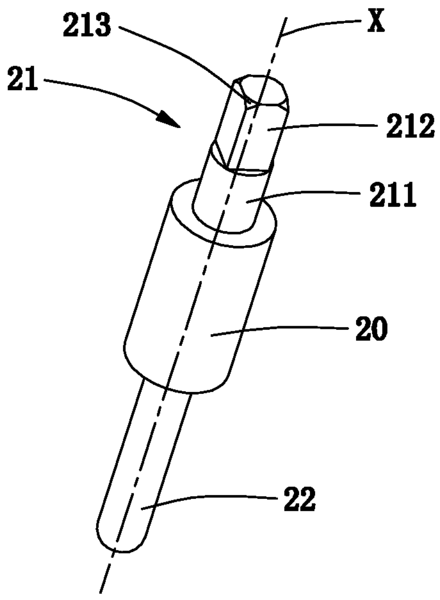
FIG. 2A is a structural schematic view of a first specific embodiment of a pin of the present invention.

FIG. 2A is a structural schematic view of a first specific embodiment of the pin of the present invention. The pin comprises a pin body 20, an insertion head 21 disposed on an end of the pin body 20, and a welding head 22 disposed on an opposite end of the pin body 20 to the insertion head 21.

Figure 2B:
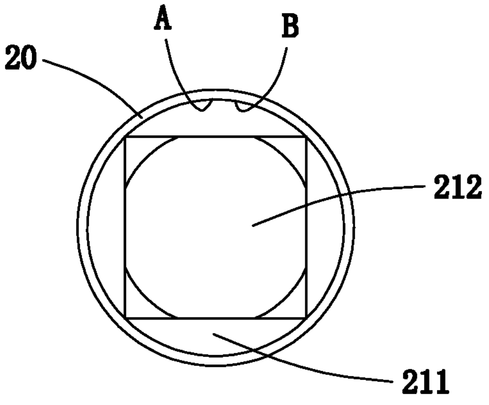
FIG. 2B is a plan view of the pin along an axis X shown in FIG. 2A.

The insertion head 21 comprises a base 211 and a guide post 212. The shape of the base 211 is a cylinder, the bottom of which is disposed on the end of the pin body 20. In the course of inserting the pin into an insertion hole of the printed circuit board, the guide post 212 can provide an exact guide function. In the first specific embodiment, the shape of the guide post 212 is a quadrangular prism. The guide post 212 is coaxially connected to the base 211 along the direction of an axis X. That is, the axis X is a central axis of the guide post 212 and the base 211. FIG. 2B is a plane view of the pin along the axis X. In FIG. 2B, a circumcircle of a cross section of the guide post 212 is marked as A, and a cross sectional circle of the base 211 is marked as B. It can be more clearly seen from FIG. 2B that the diameter size of the circumcircle A of the cross section of the guide post 212 is equal to that of the cross sectional circle B of the base 211, so the projection of the circumcircle A of the cross section of the guide post 212 completely coincides with that of the cross sectional circle B of the base 211 along the axis X. Specifically, both the cross section of the guide post and the cross sectional circle of the base 211 are perpendicular to the axis X, and the sizes of the projections of the circumcircle A and the cross sectional circle B are same so the projections of both completely coincide with each other along the axis X. In the course of inserting the insertion head 21 into the insertion hole, the guide post 212 is first inserted into the insertion hole, and then the base 211 can be smoothly inserted into the insertion hole. It is not easy for the guide post 212 to touch the sidewall of the insertion hole because of the prism structure thereof. In addition, because the projection of the circumcircle A of the cross section of the guide post 212 completely coincides with that of the cross sectional circle of the base 211 along the direction of the axis X, the base 211 may follow the guide post 212 to be smoothly inserted into the insertion hole.

Figure 3:
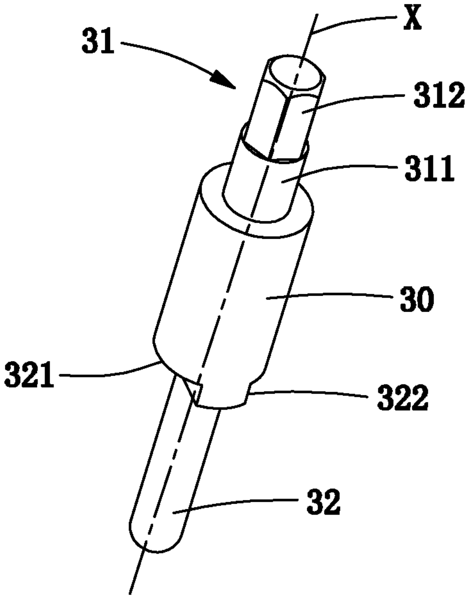
FIG. 3 is a structural schematic view of a second specific embodiment of the pin of the present invention.

FIG. 3 is a structural schematic view of a second specific embodiment of the pin. The pin comprises a pin body 30, an insertion head 31 disposed on one end of the pin body 30, and a welding head 32 disposed on the other end of the pin body 30 thereof opposite to the insertion head 31. The insertion head 31 comprises a base 311 and a guide post 312. A difference between the first and second specific embodiments is that the shape of the guide post 312 is a hexagonal prism, which can also provide the same function as the quadrangular prism.

Another difference between the first and second specific embodiments is that the pin body 30 has two cuts 321 and 322 on two opposite sides of the welding head 32. The two cuts 321 and 322 are used to vent the welding gas in a welding process of the pin and other components.

Figure 4:
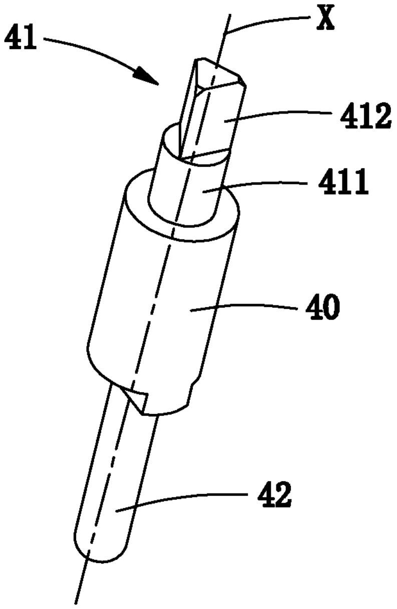
FIG. 4 is a structural schematic view of a third specific embodiment of the pin of the present invention.

FIG. 4 is a structural schematic view of a third specific embodiment of the pin of the present invention. The pin comprises a pin body 40, an insertion head 41 disposed on one end of the pin body 40, and a welding head 42 disposed on the other end of the pin body 40 thereof opposite to the insertion head 41. The insertion head 41 comprises a base 411 and a guide post 412. A difference between the first and third specific embodiments is that the shape of the guide post 412 is a triangular prism, which can also provide the same function as the quadrangular prism.

Figure 5A:
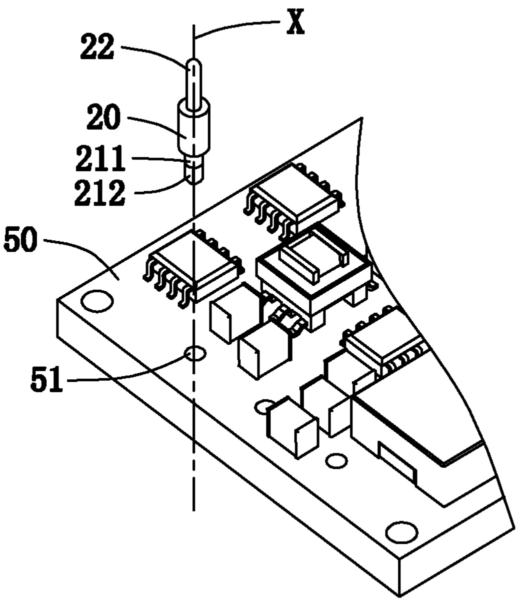
FIG. 5A is a structural schematic view of the assembly of the pin in FIG. 2A and a printed circuit board.

FIG. 5A is a structural schematic view of the assembly of the pin in FIG. 2A and a printed circuit board. The pin is inserted into an insertion hole 51 of a printed circuit board 50 along the direction of the axis X. The direction of the axis X is perpendicular to the surface of the printed circuit board 50. The welding head 22 is upwards and can be sucked up by a suction nozzle (not shown in the drawings) of an assembly machine. Then the pin is moved above the printed circuit board 50 and aligned with the insertion hole 51 to be inserted into the insertion hole 51. During the course of the assembly, the guide post 212 is first inserted into the insertion hole 51, and then the base 211 enters into the insertion hole 51, thereby completing the assembly of the pin and the printed circuit board 50. The base 211 and the insertion hole 51 should be in a clearance fit. Further, the guide post 212 has a chamfer 213, which is formed on a connection position between an end surface of the guide post 212 and a side wall of the guide post 212, as shown in FIG. 2A. The chamfer 213 can prevent the edge of the guide post 212 from touching the insertion hole 51, thereby facilitating a smoother insertion of the pin.

Figure 1A:
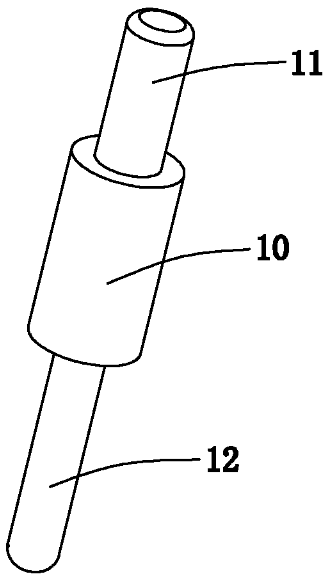
FIGS. 1A and 1B are structural schematic views of a pin in the prior art.
Figure 1B:
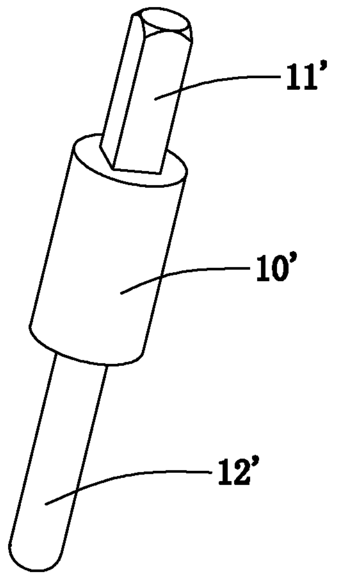

In comparison with the pins 10 and 10' in prior art, the insertion heads 11 and 11' which have single shape shown in FIGS. 1A and 1B, the pin of the present invention disposes the guide post 212 having a polygonal cross section and the base 211 having a circular section. The guide post 212 can maximally avoid rigidly touching the insertion hole 51 and the risk of not being inserted. The projection of the circumcircle A of the cross section of the guide post 212 completely coincides with that of the cross sectional circle B of the base 211 along the axis X, so that it can ensure that the base 211 may be smoothly inserted into the insertion hole 51 after the guide post 212 enters into the insertion hole 51, which can reduce the risk of manufacturing processes.

Figure 5B:
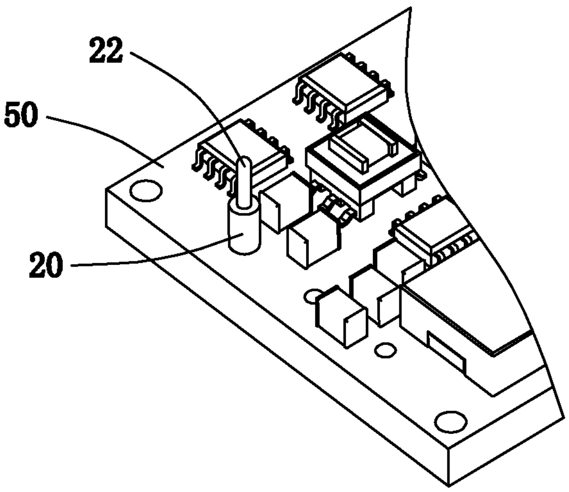
FIG. 5B is a structural schematic view of FIG. 5A after the pin is inserted into the printed circuit board.

FIG. 5B is a structural schematic view of FIG. 5A after the pin is inserted into the printed circuit board. Due to the guiding function provided by the guide post 212, a clearance gap between the base 211 and the insertion hole 51 is smaller than a clearance gap produced in the prior art. In the present invention, the clearance gap between the base 211 and the insertion hole 51 is reduced, thereby decreasing the tilt of the pin body 20 after inserted, reducing the solder material between the base 211 and the insertion hole 51, and improving the welding quality.

In conclusion, although the present invention has been disclosed by the above preferred embodiments, the above preferred embodiments are not used to limit the present invention. One of ordinary skills in the art can also make all sorts of improvements and amendments within the principles of the present invention. Therefore, the protection scope of the present invention should be based on the scope defined by the appended claims.

What is claimed is:

1. A pin, comprising:

a pin body; and an insertion head disposed on an end of the pin body and including a base and a guide post;

the base being cylindrical, the bottom of which is disposed on the end of the pin body; and the guide post being a prism, which is coaxially connected to the base;

wherein the projection of a circumcircle of a cross section of the guide post completely coincides with that of a cross sectional circle of the base along the direction of an axis of the guide post, and both the cross section of the guide post and the cross sectional circle of the base are perpendicular to the axis of the guide post.

2. The pin as claimed in claim 1, further comprising a welding head, which is disposed on an opposite end of the pin body to the insertion head.

3. The pin as claimed in claim 2, wherein the pin body further has a cut located on two opposite sides of the welding head.

4. The pin as claimed in claim 1, wherein the prism can be selected from any one of a triangular prism, a quadrangular prism, and a hexagonal prism.

5. The pin as claimed in claim 1, wherein the guide post has a chamfer formed on a connection position between an end surface of the guide post and a side wall of the guide post.

6. A printed circuit board, comprising:

an insertion hole; and a pin, being inserted into the insertion hole and comprising:

a pin body; and an insertion head disposed on an end of the pin body and including a base and a guide post;

the base being cylindrical, the bottom of which is disposed on the end of the pin body; and the guide post being a prism, which is coaxially connected to the base;

wherein the projection of a circumcircle of a cross section of the guide post completely coincides with that of a cross sectional circle of the base along the direction of an axis of the guide post, and both the cross section of the guide post and the cross sectional circle of the base are perpendicular to the axis of the guide post.

7. The printed circuit board as claimed in claim 6, further comprising a welding head, which is disposed on an opposite end of the pin body to the insertion head.

8. The printed circuit board as claimed in claim 7, wherein the pin body further has a cut located on two opposite sides of the welding head.

9. The printed circuit board as claimed in claim 6, wherein the prism can be selected from any one of a triangular prism, a quadrangular prism, and a hexagonal prism.

10. The printed circuit board as claimed in claim 6, wherein the guide post has a chamfer formed on a connection position between an end surface of the guide post and a side wall of the guide post.

* * * * *